United States Patent
Yoon

(10) Patent No.: US 9,064,605 B2
(45) Date of Patent: Jun. 23, 2015

(54) SEMICONDUCTOR SYSTEM AND METHOD FOR REPARING THE SAME

(71) Applicant: SK hynix Inc., Icheon-si Gyeonggi-do (KR)

(72) Inventor: Hyun Su Yoon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 162 days.

(21) Appl. No.: 14/019,705

(22) Filed: Sep. 6, 2013

(65) Prior Publication Data

US 2015/0009770 A1 Jan. 8, 2015

(30) Foreign Application Priority Data

Jul. 8, 2013 (KR) ........................ 10-2013-0079576

(51) Int. Cl.
| | | |
|---|---|---|
| G11C 7/06 | (2006.01) | |
| G11C 29/00 | (2006.01) | |
| G11C 8/00 | (2006.01) | |
| G11C 29/04 | (2006.01) | |
| G11C 29/44 | (2006.01) | |

(52) U.S. Cl.
CPC ........ G11C 29/04 (2013.01); *G11C 2029/4402* (2013.01)

(58) Field of Classification Search
USPC ............... 365/189.07, 200, 225.7, 233.1, 236
See application file for complete search history.

(56) References Cited

U.S. PATENT DOCUMENTS

| | | | | |
|---|---|---|---|---|
| 6,181,614 B1* | 1/2001 | Aipperspach et al. | ........ | 365/200 |
| 6,333,878 B2* | 12/2001 | Ooishi | ........... | 365/200 |
| 6,388,929 B1* | 5/2002 | Shimano et al. | ............. | 365/200 |
| 6,558,967 B1* | 5/2003 | Wong | ............. | 365/200 |
| 6,704,226 B2* | 3/2004 | Lee | ............. | 365/200 |
| 6,940,765 B2* | 9/2005 | Kyung | ............ | 365/200 |
| 7,336,549 B2* | 2/2008 | Min et al. | ........ | 365/200 |
| 7,706,198 B2* | 4/2010 | Jeong et al. | ......... | 365/200 |
| 7,908,527 B2* | 3/2011 | Kohara et al. | ......... | 365/201 |
| 8,023,347 B2* | 9/2011 | Chu et al. | ............. | 365/200 |
| 8,238,177 B2* | 8/2012 | Yamauchi | .......... | 365/200 |
| 8,767,491 B1* | 7/2014 | Wu et al. | ........... | 365/200 |

FOREIGN PATENT DOCUMENTS

| | | | |
|---|---|---|---|
| KR | 1020100004983 A | 1/2010 | |
| KR | 1020130026973 A | 3/2013 | |

* cited by examiner

*Primary Examiner* — Trong Phan
(74) *Attorney, Agent, or Firm* — William Park & Associates Ltd.

(57) ABSTRACT

Provided is a semiconductor system and method for repairing the same that may improve repair capacity of the semiconductor system. The semiconductor system comprises a semiconductor circuit configured to output a remaining repair information and perform a repair operation in response to an external command, and a host configured to determine a number of available repairs based on the remaining repair information and provide the semiconductor circuit with the external command based on the number of available repairs.

18 Claims, 3 Drawing Sheets

SEMICONDUCTOR SYSTEM AND METHOD FOR REPARING THE SAME

CROSS-REFERENCES TO RELATED APPLICATION

The present application claims priority under 35 U.S.C. §119(a) to Korean application number 10-2013-0079576, filed on Jul. 8, 2013, in the Korean Intellectual Property Office, which is incorporated by reference herein in its entirety.

BACKGROUND

1. Technical Field

Various embodiments relate to a semiconductor circuit, and more particularly, to a semiconductor system and method for repairing the same.

2. Related Art

In fabricating or packaging a semiconductor circuit including a semiconductor memory with a data storage region, memory cells of the data storage region may fail.

It is hard to repair failed memory cells after completion of the packaging even though the semiconductor circuit may include a repair circuit for replacing failed memory cell(s) with a redundant memory cell(s).

SUMMARY

A semiconductor system whose repair capacity is improved and method for repairing the same is described herein.

In an embodiment of the present invention, a semiconductor system comprises a semiconductor circuit configured to output a remaining repair information and perform a repair operation in response to an external command, and a host configured to determine a number of available repairs based on the remaining repair information and provide the semiconductor circuit with the external command based on the number of available repairs.

In an embodiment of the present invention, a method for repairing a semiconductor system including a semiconductor circuit and a host, comprises generating by the semiconductor circuit a remaining repair information defining a number of available repairs, receiving by the host the remaining repair information from the semiconductor circuit, and controlling by the host a repair operation of the semiconductor circuit based on the remaining repair information.

In an embodiment of the present invention, a method for repairing a semiconductor system including a semiconductor circuit and a host, comprises generating by the semiconductor circuit a remaining repair information defining a number of available repairs, receiving by the host the remaining repair information from the semiconductor circuit each time a memory cell in the semiconductor circuit needs to be repaired, and controlling by the host a repair operation of the semiconductor circuit based on the remaining repair information.

BRIEF DESCRIPTION OF THE DRAWINGS

Features, aspects, and embodiments are described in conjunction with the attached drawings, in which.

DETAILED DESCRIPTION

Figure 1:
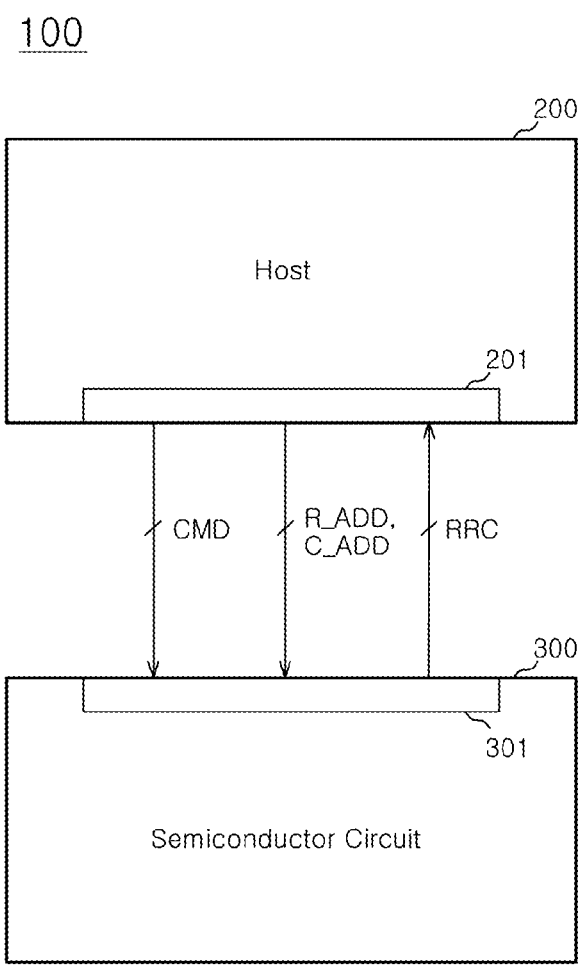
FIG. 1 is a block diagram of a semiconductor system 100 according to one embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey a scope of the present invention to those skilled in the art. Throughout the disclosure, like reference numerals refer to like parts throughout the various figures and embodiments of the present invention.

FIG. 1 is a block diagram of a semiconductor system 100 according to one embodiment.

As illustrated in FIG. 1, the semiconductor system 100 according to one embodiment may include a host 200 and a semiconductor circuit 300.

The semiconductor circuit 300 may be configured to output a remaining repair information RRC and to perform a repair operation in response to an external command CMD, a row address R_ADD and a column address C_ADD. In an embodiment, the semiconductor circuit 300 performs the repair operation when in the repair mode, in response to the external command CMD.

The remaining repair information RRC may include information about a number of available repairs in the semiconductor circuit 300.

The semiconductor circuit 300 may receive the external command CMD, the row address R_ADD, and the column address C_ADD and output the remaining repair information RRC, through an interface block 301.

The interface block 301 may include one or more pads. The remaining repair information RRC may be output through a data input/output pad DQ among the pads.

The host 200 may be configured to determine the number of available repairs in the semiconductor circuit 300 based on the remaining repair information RRC and to provide the external command CMD for a repair operation based on the number of available repairs.

The external command CMD may define various commands with a combination of some commands which instruct the semiconductor circuit 300. The various commands may include commands for entering a repair mode, outputting the remaining repair information RRC, repair program, activation (ACT), precharge (PRE), write (WT), read (RD), and so forth.

The semiconductor circuit 300 enters the repair mode in response to an external command (CMD) instructing the semiconductor circuit 300 to enter the repair mode. When in the repair mode, if the semiconductor circuit 300 receives the read command RD, the semiconductor circuit 300 may output the remaining repair information RRC in response to receiving the read command RD. Also, when in the repair mode, receipt of a write command WT may be a command that indicates that the semiconductor circuit 300 should perform a repair program.

For use of the remaining repair information RRC, the host 200 may receive the remaining repair information RRC from the semiconductor circuit 300 each time the host 200 needs the remaining repair information RRC without storing the remaining repair information RRC.

On the other hand, the host 200 may receive and store the remaining repair information RRC in a memory region (not illustrated). The host 200 may be configured to keep a value, such as a count value, associated with each remaining repair information RRC. In this case, the host 200 may be configured to keep the value of the remaining repair information RRC synchronized with that stored in the semiconductor circuit 300 by decreasing the count value associated with the remaining repair information RRC by one each time a repair operation is performed.

The host 200 may provide the semiconductor circuit 300 with the row address R_ADD, and the column address C_ADD.

The host 200 may output the external command CMD, the row address R_ADD, and the column address C_ADD and receive the remaining repair information RRC, through an interface block 201.

The interface block 201 may include one or more pads. The remaining repair information RRC may be received through a data input/output pad DQ among the pads.

Figure 2:
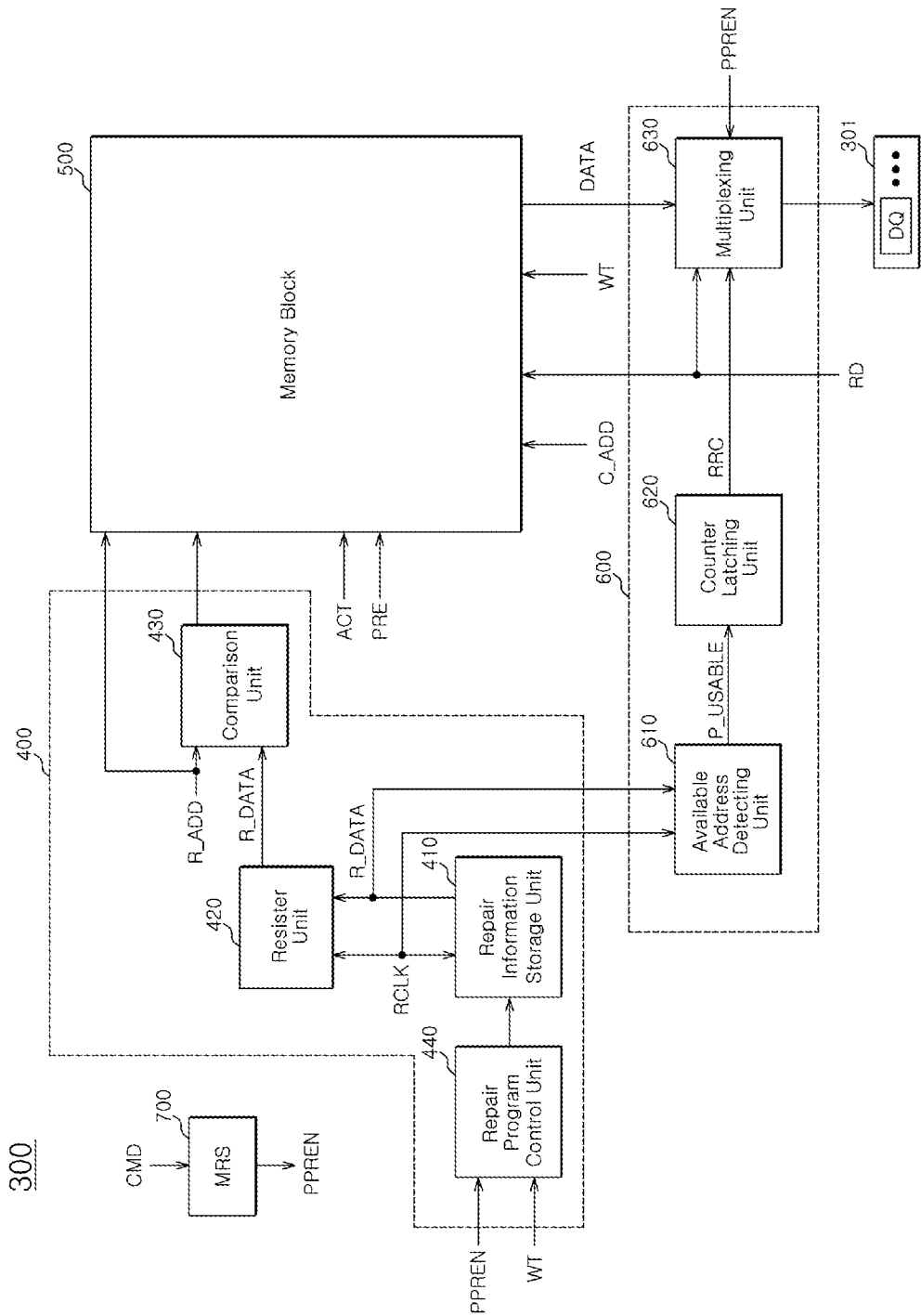
FIG. 2 is a block diagram illustrating a configuration of a semiconductor circuit 300 shown in FIG. 1.

FIG. 2 is a block diagram illustrating a configuration of the semiconductor circuit 300 shown in FIG. 1.

As illustrated in FIG. 2, the semiconductor circuit 300 may include a repair block 400, a memory block 500, a remaining repair information processing block 600, and a mode resister (MRS) 700.

The mode resister 700 may be configured to generate a repair enable signal PPREN in response to the external command CMD.

The memory block 500 may be configured to perform a write or a read operation in response to internal commands and external addresses. The internal commands are a decoded version of the external commands CMDs, namely active command ACT, precharge command PRE, write command WT, and read command RD. In one embodiment, the memory block 500 is configured to perform write/read operations in response to the external command CMD and an external address. The external addresses are the row address R_ADD and the column address C_ADD.

The repair block 400 may be configured to perform a repair program based on repair information R_DATA, and the repair block 400 may be configured to decide whether or not an external address, for example the row address R_ADD, is equal to the repair information R_DATA in a repair mode.

The repair mode may include a post package repair (PPR) mode for repairing failed memory cells after completion of packaging of the semiconductor system.

The repair block 400 may include a repair information storage unit 410, a resister unit 420, a comparison unit 430, and a repair program control unit 440.

The repair information storage unit 410 may be configured to store the repair information R_DATA and to output the stored repair information R_DATA in response to a clock signal RCLK.

The repair information R_DATA may include one or more repair addresses.

The repair information storage unit 410 may be configured with a non-volatile memory to store the repair information R_DATA. The repair information storage unit 410 may be configured with one or more electrical fuses.

The resister unit 420 may be configured to temporarily store the repair information R_DATA, and output the repair information R_DATA in response to the clock signal RCLK.

The comparison unit 430 may be configured to provide the memory block 500 with the result of a comparison between the external address, for example the row address R_ADD, and the repair information R_DATA.

According to the result of the comparison performed by the comparison unit 430, a wordline corresponding to the row address R_ADD or a redundancy wordline replacing the row address R_ADD may be selected in the memory block 500.

For example, a wordline corresponding to the row address R_ADD may be selected in the memory block 500 if the row address R_ADD is not equal to the repair address in the repair information R_DATA.

A redundancy wordline replacing the row address R_ADD may be selected in the memory block 500 if the row address R_ADD is equal to the repair address in the repair information R_DATA.

The repair program control unit 440 may be configured to program the repair information R_DATA in the repair information storage unit 410 in response to the repair enable signal PPREN and the write command WT.

If the repair information storage unit 410 is configured with one or more electrical fuses, the repair program control unit 440 may be configured to program the repair information R_DATA through rupture of the electrical fuses. The rupture may be caused by a high-voltage application.

In the repair mode, if the repair enable signal PPREN is of active state, the repair program control unit 440 programs a repair address of the repair information R_DATA corresponding to a failed memory cell in response to the write command WT.

The remaining repair information processing block 600 may be configured to detect and count a number of available repair addresses among a plurality of available repair addresses in the repair information R_DATA, where the repair addresses includes addresses of memory cells that are not programmed. The remaining repair information processing block 600 may be further configured to store the number of available repair addresses as the remaining repair information RRC.

The remaining repair information processing block 600 may be configured to output the stored remaining repair information RRC to the interface block 301 in response to the repair enable signal PPREN and the read command RD.

In the repair mode when the repair enable signal PPREN is of the active state, the remaining repair information processing block 600 outputs the stored remaining repair information RRC to the host 200 through the interface block 301 in response to the read command RD.

The remaining repair information processing block 600 may include an available address detecting unit 610, a counter latching unit 620, and a multiplexing unit 630.

The available address detecting unit 610 may be configured to detect an available repair address in the repair information R_DATA where the repair information R_DATA includes a repair address that is not programmed. The available address detecting unit 610 may be further configured to generate a detection signal P_USABLE in response to the clock signal RCLK.

In the repair information R_DATA, a repair address with a value of logic high may be defined as a used repair address, i.e. a repair address that is programmed. A repair address with a value of logic low may be defined as an available repair address, i.e. a repair address that is not programmed.

The available address detecting unit 610 may generate the detection signal P_USABLE when detecting the repair address with a value of logic low.

The detection signal P_USABLE may be of a pulse type.

The counter latching unit 620 may be configured to count, latch and output the detection signal P_USABLE as the remaining repair information RRC.

The multiplexing unit 630 may be configured to output the remaining repair information RRC to the interface block 301 in response to the repair enable signal PPREN and the read command RD.

In the repair mode if the repair enable signal PPREN is of the active state, the multiplexing unit 630 may output the remaining repair information RRC to the host 200 through a data input/output pad DQ of the interface block 301 in response to the read command RD.

In a normal mode if the repair enable signal PPREN is of inactive state, the multiplexing unit 630 may output data from the memory block 500 to the host 200 via the interface block 301 in response to the read command RD.

Figure 3:
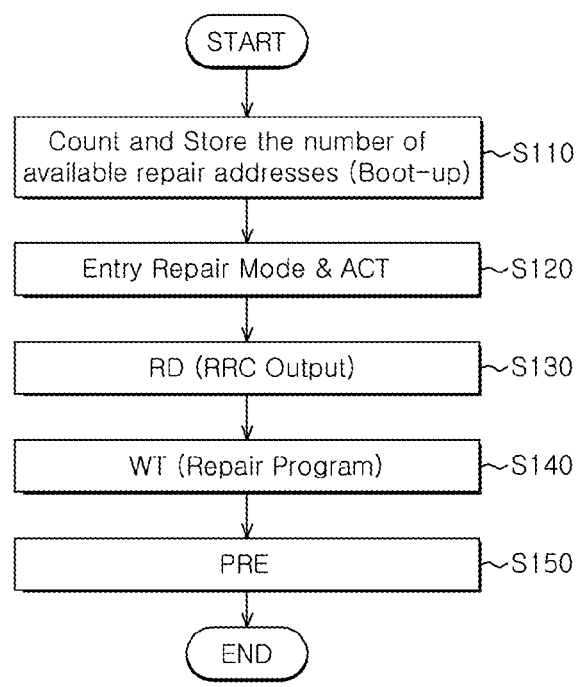
FIG. 3 is a flow chart for describing a method for repairing the semiconductor system 100 according to one embodiment.

FIG. 3 is a flow chart for describing a method for repairing the semiconductor system 100 according to one embodiment.

A repair method of the semiconductor system 100 according to an embodiment is described in conjunction with FIGS. 1 to 3.

The semiconductor circuit 300 may perform a repair operation through a test process before packaging.

The host 200 does not have information about whether the semiconductor circuit 300 can perform additional repair operations.

In step S110, the semiconductor circuit 300 therefore counts the number of available repair addresses among a plurality of repair addresses and stores the number of available repair addresses as the remaining repair information RRC in an initializing process, for example a boot-up process.

In step S120, the host 200 places the semiconductor circuit 300 into the repair mode by communicating the command for entering the repair mode to the semiconductor circuit 300, and the host 200 outputs the active command to the semiconductor circuit 300.

In step S130, the host 200 outputs the command for outputting the remaining repair information RRC, that is, the read command RD, to the semiconductor circuit 300. The semiconductor circuit 300 outputs the remaining repair information RRC to the host 200 if the external command defines a read command RD when the semiconductor circuit 300 is in the repair mode. In one embodiment, the semiconductor circuit 300 outputs the remaining repair information RRC after a preset latency from the time of receiving the read command RD.

The host 200 may retrieve from the remaining repair information RRC information about how many repair operations the semiconductor circuit 300 can additionally perform.

After completion of packaging, the host 200 may detect failure of a memory cell in the memory block 500 of the semiconductor circuit 300 through the course of data communication with the semiconductor circuit 300 or another test process.

In step S140, the host 200 outputs the command for repair program (i.e. the write command WT), the row address R_ADD and the column address C_ADD to the semiconductor circuit 300 because the host 200 has information from the remaining repair information RRC concerning how many repair operations the semiconductor circuit 300 can perform.

Accordingly, the semiconductor circuit 300 programs the repair information R_DATA corresponding to the failed memory cell.

In step S150, the host 200 ends the repair mode by outputting the precharge command PRE.

After the repair process described in conjunction with FIG. 3, the host 200 may detect additional failures of a memory cell(s) in the memory block 500 of the semiconductor circuit 300.

The repair process may be repeated each time an additional failure of a memory cell in the memory block 500 is detected.

As described above, the host 200 may receive the remaining repair information RRC from the semiconductor circuit 300 to be used as the remaining repair information RRC each time the host 200 needs the remaining repair information RRC. The host 200 does not have to store the remaining repair information RRC.

If the host 200 receives the remaining repair information RRC without storing it, the repair process described in conjunction with FIG. 3 may be repeated as an additional repair process.

Also as described above, the host 200 may receive and store the remaining repair information RRC in a memory region (not illustrated) for use as the remaining repair information. In this case, the host 200 may be configured to keep the value of the remaining repair information RRC synchronized with a value of the remaining repair information RRC stored in the semiconductor circuit 300 by decrementing a count value of the remaining repair information RRC by one each time a repair operation is performed.

If the host 200 receives and stores the remaining repair information RRC in a memory region, the step S130 of reading the remaining repair information RRC may be skipped in an additional repair process other than the initial repair process, for example a repair process according to the post package repair (PPR) mode.

While certain embodiments have been described above, it will be understood to those skilled in the art that the embodiments described are by way of example only. Accordingly, the system and method described herein should not be limited based on the described embodiments. Rather, the system and method described herein should only be limited in light of the claims that follow when taken in conjunction with the above description and accompanying drawings.

What is claimed is:

1. A semiconductor system comprising:
    a semiconductor circuit configured to output a remaining repair information and perform a repair operation in response to an external command; and
    a host configured to determine a number of available repairs based on the remaining repair information and provide the semiconductor circuit with the external command based on the number of available repairs.

2. The semiconductor system of claim 1, wherein the semiconductor circuit performs the repair operation in a repair mode in response to an external command.

3. The semiconductor system of claim 1, wherein the semiconductor circuit performs the repair operation in a post package repair (PPR) mode in response to an external command.

4. The semiconductor system of claim 1, wherein the semiconductor circuit counts a number of available repair addresses among a plurality repair addresses and stores the number of available repair addresses as the remaining repair information.

5. The semiconductor system of claim 1, wherein the semiconductor circuit counts a number of available repair addresses among a plurality repair addresses and stores the number of available repair addresses as the remaining repair information in a boot-up process.

6. The semiconductor system of claim 1, wherein the semiconductor circuit outputs the remaining repair information to the host when the external command defines a read command.

7. The semiconductor system of claim 1, wherein the semiconductor circuit in a repair mode outputs the remaining repair information to the host when the external command defines a read command.

8. The semiconductor system of claim 1, wherein the semiconductor circuit is configured to output the remaining repair information through a data input/output pad (DQ).

9. The semiconductor system of claim 1, wherein the host stores the remaining repair information in a memory region for use as the remaining repair information.

10. The semiconductor system of claim 1, wherein the host is configured to keep a value of the remaining repair information synchronized with a value of the remaining repair information stored in the semiconductor circuit by decrementing a count value of the remaining repair information each time a repair operation is performed.

11. The semiconductor system of claim 1, wherein the semiconductor circuit comprises:
    a memory block configured to perform write/read operation in response to the external command and an external address;
    a repair block configured to perform a repair program based on a repair information and to decide whether or not an external address is equal to the repair information in a repair mode; and
    a remaining repair information processing block configured to count a number of available repair addresses among plural repair addresses included in the repair information and to store the number of available repair addresses as the remaining repair information.

12. The semiconductor system of claim 11, wherein the semiconductor circuit further comprises a mode resister configured to generate a repair enable signal in response to the external command.

13. The semiconductor system of claim 11, wherein the remaining repair information processing block is configured to output the remaining repair information to the host when the external command defines a read command in the repair mode.

14. The semiconductor system of claim 11, wherein the repair block comprises:
    a repair information storage unit configured to store the repair information and to output the stored repair information;
    a comparison unit configured to provide the memory block with a result of a comparison between the external address and the repair information; and
    a repair program control unit configured to program the repair information when the external command defines a write command in the repair mode.

15. The semiconductor system of claim 14, wherein the repair information storage unit includes a non-volatile memory to store the repair information.

16. The semiconductor system of claim 15, wherein the repair program control unit is configured to program the repair information through rupture of the non-volatile memory.

17. The semiconductor system of claim 11, wherein the remaining repair information processing block comprises:
    an available address detecting unit configured to detect an available repair address in the repair information and to generate a detection signal;
    a counter latching unit configured to count, latch and output the detection signal as the remaining repair information; and
    a multiplexing unit configured to output the remaining repair information to the host when the external command defines a read command in the repair mode.

18. The semiconductor system of claim 17, wherein the multiplexing unit is configured to output data from the memory block to the host when the external command defines the read command in a normal mode.

* * * * *